United States Patent
Chen et al.

(10) Patent No.: US 7,086,020 B2
(45) Date of Patent: Aug. 1, 2006

(54) CIRCUITS AND METHODS FOR MATCHING DEVICE CHARACTERISTICS FOR ANALOG AND MIXED-SIGNAL DESIGNS

(75) Inventors: Howard Hao Chen, Yorktown Heights, NY (US); Louis Lu-Chen Hsu, Fishkill, NY (US); Charlie Chornglii Hwang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 10/733,079

(22) Filed: Dec. 11, 2003

(65) Prior Publication Data

US 2005/0132314 A1    Jun. 16, 2005

(51) Int. Cl.
*G06F 17/50* (2006.01)
(52) U.S. Cl. .................. 716/4; 716/5; 716/7; 716/11
(58) Field of Classification Search .............. 716/4, 716/11, 7, 5
See application file for complete search history.

(56) References Cited

U.S. PATENT DOCUMENTS

| | | | |
|---|---|---|---|
| 5,557,234 A | 9/1996 | Collins | |
| 5,952,698 A | 9/1999 | Wong et al. | |
| 6,172,555 B1 | 1/2001 | Gusinov | |
| 6,876,576 B1 * | 4/2005 | Hidaka | 365/171 |
| 2002/0163835 A1 * | 11/2002 | Chen et al. | 365/185.18 |
| 2005/0044522 A1 * | 2/2005 | Maeda | 716/18 |
| 2005/0076320 A1 * | 4/2005 | Maeda | 716/10 |

\* cited by examiner

*Primary Examiner*—Paul Dinh
*Assistant Examiner*—Tuyen To
(74) *Attorney, Agent, or Firm*—F. Chau & Associates, LLC; Frank V. DeRosa, Esq.

(57) ABSTRACT

Circuit designs and methods are provided for matching device characteristics for, e.g., analog or mixed-signal semiconductor integrated circuit designs. In particular, circuit layout patterns and layout methods are provided which enable precise or proportional matching of circuit components by uniformly distributing circuit components in a manner that eliminates or significantly minimizes the sensitivity of such circuit components to environmental effects and process variations, thereby improving the performance of analog and mixed-signal circuits.

31 Claims, 10 Drawing Sheets

CIRCUITS AND METHODS FOR MATCHING DEVICE CHARACTERISTICS FOR ANALOG AND MIXED-SIGNAL DESIGNS

TECHNICAL FIELD OF THE INVENTION

The present invention relates generally to circuit designs and methods that provide matching of device characteristics for analog or mixed-signal semiconductor integrated circuits. More specifically, the invention relates to circuit layout patterns and layout methods that provide precise or proportional matching of circuit components by uniformly distributing the circuit components in a manner that eliminates or significantly minimizes the sensitivity of such components to environmental effects and process variations, thereby improving the performance of analog and mixed-signal circuits.

BACKGROUND

In the design of semiconductor integrated circuits, it is very important to consider variations in device characteristics (device mismatch) such as Vt (threshold voltage) for a given circuit design, in order to achieve circuit robustness and obtain high manufacturing functional yields for such devices. The matching of device characteristics is particularly critical for the design of analog and mixed-signal circuits, including, but not limited to, differential amplifiers, current mirrors, digital-to-analog converters (DAC), bandgap reference circuits, etc., where relatively small device mismatches can significantly reduce the efficiency or operability of such circuits for a given application.

In general, variations in device characteristics can result from variations in a manufacturing process (process variations) which affect some or all N-doped or P-doped elements of a circuit depending on, e.g., the orientation, geometry and/or location of a device. For example, when manufacturing a semiconductor chip, variations in device characteristics can result from variations in mask dimensions (which causes geometry variations), variations in material properties of wafers, resists, etc., variations in the manufacturing equipment and environment (e.g., lens aberrations, flow turbulence, oven temperature, etc.) and variations in process settings (implant dose, diffusion time, focus, exposure energy, etc.).

Moreover, two identical adjacent devices may behave differently for various reasons. For example, variations in Vt between neighboring transistors can result from fluctuations in number and position of dopant atoms or randomness in line edge roughness of devices. Further, layout asymmetry, pattern density difference variations, and oxidation rate difference due to stress from isolation, all contribute to device mismatch to a certain degree. These mismatches result in different threshold voltages, different current flows, different carrier mobility, and different trigger points. Another source of mismatch is the known "well proximity effect" due to dopants being scattered along the n-well or p-well sidewalls and corners resulting in a non-uniform doping profile. Indeed, depending on the distance between the device and the edge of the well, the difference in threshold voltage could be as much as 800 mV within a distance of 3 microns.

It is known that larger devices can tolerate more threshold mismatch than the smaller devices. Indeed, process mismatch due to lithographic patterning, ion implantation, chemical-mechanical polishing, oxidation, or CVD deposition, makes smaller devices with short channel lengths especially prone to device mismatch problem. On the other hand, although larger devices are not as sensitive to threshold mismatch, their capacitive loading makes them unsuitable for high-frequency operations. Furthermore, larger devices consume more chip area and more power, which increases the cost.

SUMMARY OF THE INVENTION

Exemplary embodiments of the invention include circuit designs and methods that provide matching of device characteristics for, e.g., analog or mixed-signal semiconductor integrated circuit designs. In particular, exemplary embodiments of the invention include circuit layout patterns and layout methods that provide precise or proportional matching of circuit components by uniformly distributing circuit components in a manner that eliminates or significantly minimizes the sensitivity of such circuit components to environmental effects and process variations, thereby improving the performance of analog and mixed-signal circuits.

In one exemplary embodiment of the invention, a method for matching electrical characteristics of components of a semiconductor integrated circuit includes dividing at least a first component and a second component of a semiconductor integrated circuit into a plurality of unit cells, wherein the first component and second component are components whose electrical properties are to be precisely or proportionally matched, and wherein each unit cell is the same size, and then uniformly distributing the plurality of unit cells for the first and second components in an array. The components can be transistors, diodes, capacitors, or resistors, for example.

In another exemplary embodiment of the invention, the process of uniformly distributing the unit cells is performed by optimally arranging the unit cells of the components in an array structure to maximize layout symmetry of the components and render the circuit (e.g., analog circuit) insensitive to environmental effects, such as uneven lithographic patterning, ion implanting, oxidation, thermal annealing, chemical-mechanical polishing and well proximity effect.

In another exemplary embodiment of the invention, one or more circuit components can be selected as a master (reference) component whose electrical parameters are precisely transferred (1:1 ratio) or proportionally transferred (any ratio, a:b) to one or more slave components. For example, one or more slave components that have a different area ratio with respect to each other and/or the master component(s) can be uniformly distributed by dividing the components into either full-unit cells or dividing the components into sub-unit cells that are filled with dummy elements, and evenly distributing the full-unit and sub-unit cells in an array structure. For slave components that are proportionally smaller than a master component, sub-unit cells with dummy elements can be used to facilitate even distribution of such slave components in the array and around the master component.

Furthermore, in one exemplary embodiment of the invention, a master (reference) component can be placed in a central location of an array among the plurality of slave devices, so that the electrical parameters of the master component can be evenly mapped to the slave components. Furthermore, a plurality of dummy cells can be placed in empty lots in the array and around an outer perimeter of the array to minimize the well-proximity edge effect.

These and other exemplary embodiments, aspects, features and advantages of the present invention will become apparent from the following detailed description of exemplary embodiments, which is to be read in connection with the accompanying drawings.

DETAILED DESCRIPTION OF EXEMPLARY EMBODIMENTS

Exemplary embodiments of the invention generally include circuit designs and methods that provide matching of device characteristics for analog or mixed-signal semiconductor integrated circuits. Exemplary embodiments of the invention include circuit layout patterns and layout methods that provide precise or proportional matching of circuit components by uniformly distributing the circuit components in a manner that eliminates or significantly minimizes the sensitivity of such components to environmental effects and process variations, thereby improving the performance of analog and mixed-signal circuits.

Figure 1:
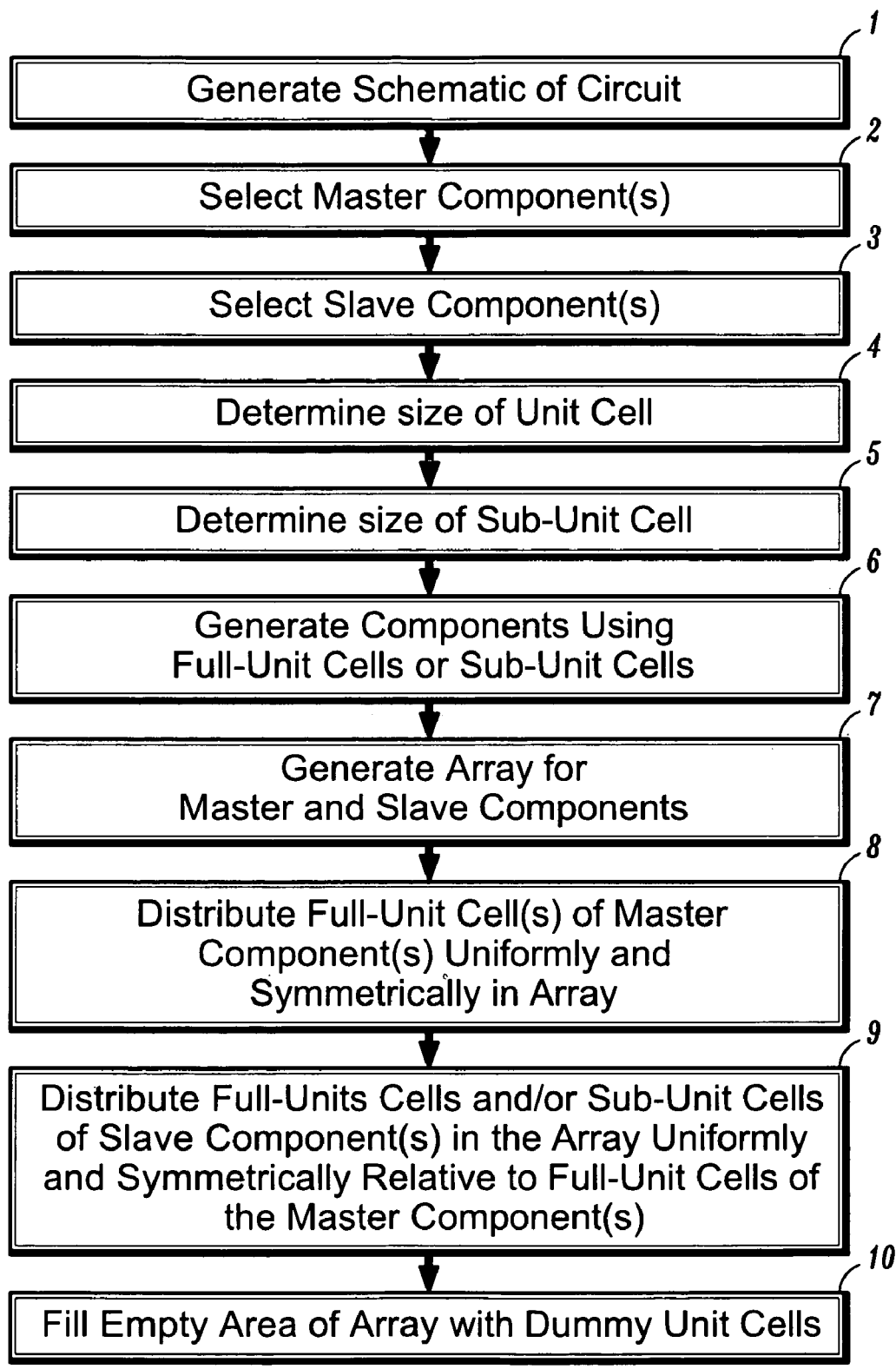
FIG. 1 is a flow diagram illustrating a method for matching electrical characteristics of two or more components of a semiconductor integrated circuit, according to an exemplary embodiment of the invention.

FIG. 1 is a flow diagram illustrating a method for matching electrical characteristics of two or more components of a semiconductor integrated circuit, according to an exemplary embodiment of the invention. It is to be understood that the methods described herein with reference to FIG. 1, for example, can represent physical process steps that occur during the design and fabrication of a semiconductor integrated circuit according to the invention. In addition, the method steps depicted in FIG. 1 can represent processing that occurs using various forms of hardware, software, firmware, special purpose processors, or a combination thereof, as part of a CAD (computer aided design) tool for circuit design and analysis. In particular, the method steps can be implemented using program instructions that are tangibly embodied on one or more program storage devices (e.g., hard disk, magnetic floppy disk, RAM, ROM, CD ROM, etc.) and executed by any device or machine comprising suitable architecture. It is to be further understood that, because the methods steps depicted in the accompanying Figures can be implemented in software, the logic flow of method steps may differ depending upon the manner in which the present invention is programmed. Given the teachings herein, one of ordinary skill in the related art will be able to contemplate these and similar implementations or configurations of the present invention.

The exemplary method of FIG. 1 will now be described in detail, with further reference to the exemplary diagrams of FIGS. 2A–2C for illustrative purposes. Referring to FIG. 1, Initially, a circuit designer will generate a schematic of a circuit having components that are to be precisely matched (step 1). In one exemplary embodiment of the invention, circuit components that are to be precisely matched are referred to herein as "master" components (or reference components) and "slave" components. A "master" component is a circuit component whose electrical parameters are to be precisely transferred or proportionally transferred to one or more "slave" components. These master/slave components can be transistors, diodes, capacitors, or resistors. Moreover, there can be one or more "master" components. Accordingly, one or more components will be selected as "master" components (step 2) and one or more components to be matched to the master component(s) will be selected as the slave components (step 3).

Figure 2A:
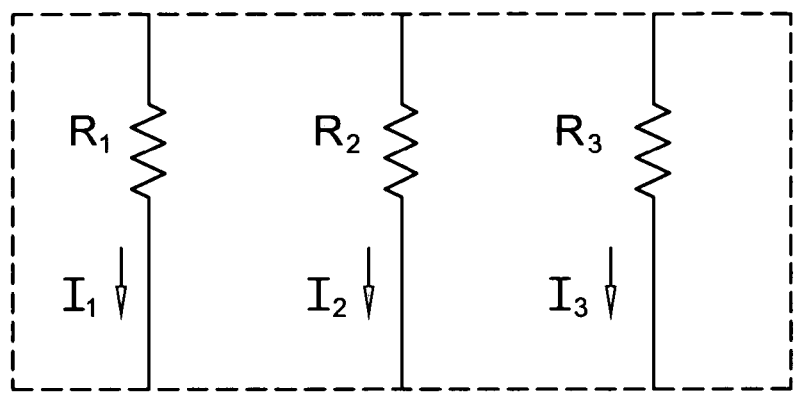
FIGS. 2A, 2B and 2C are exemplary diagrams to facilitate explanation of a method for matching electrical characteristics of two or more components according to an embodiment of the invention.

By way of example, FIG. 2A is an exemplary schematic circuit diagram illustrating a portion of circuit comprising resistive elements $R_1$, $R_2$ and $R_3$. Assume, for a given application, that the circuit is designed such that the ratios for the resistive elements are to be closely tracked as follows:

$$\frac{R_1}{R_2} = \frac{3}{2} \text{ and } \frac{R_3}{R_2} = \frac{5}{2}$$

to obtain branch currents $I_1$, $I_2$ and $I_3$ that are proportionally matched. In this example, the resistive element $R_2$ can be selected as the "master" component, and the resistive elements $R_1$ and $R_3$ can be selected as the "slave" components, which are to be matched proportionally to master component $R_2$.

Referring again to FIG. 1, the circuit designer will then determine the size of a "unit cell" (or "unit element") for the master and slave components (step 4), wherein the "unit cell" is used for dividing the master and slave components into a plurality of component cells that are to be distributed (as discussed below). The size of a "unit cell" will vary depending on the "unit value" of the "unit cell" and the number of elements that are used to form the "unit cell". By way of example, assuming the resistor ratios for $R_1$, $R_2$ and $R_3$ as set forth above, the resistors can be divided into "unit cells", where each unit cell has a unit value of 1 Ohm, for example. Further, as depicted in FIG. 2B, a unit cell, C1, can be formed using one unit of resistive element, $R_U$, having a value of 1 Ohm, or as depicted in FIG. 2C, a unit cell, C2, can be defined using two sub-units of resistive element, $R_{SU}$, each having a value of 0.5 Ohms.

Referring again to FIG. 1, the size of a "sub-unit" cell can be defined (step 5) for slave components whose sizes are smaller than a "unit cell", to enable matching of corresponding component cells between the master and slave components. In particular, in one exemplary embodiment of the invention, a "sub-unit cell" will have the same size as a "unit cell" (same layout area and number of elements), but one or more of such elements are "dummy elements". The term "full-unit cell" as used herein refers to a "unit cell" in which all elements of the "unit cell" are actually implemented. The term "sub-unit cell" refers to a "unit cell" in which one or more elements are dummy elements. Accordingly, in one exemplary embodiment of the invention, the size of a "full-unit cell" and the size of a "sub-unit cell" are the same.

Figure 2B:
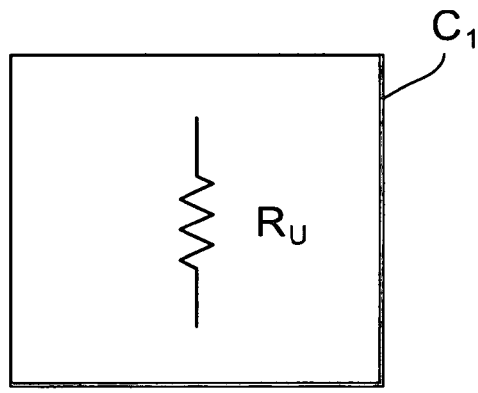
Figure 2C:
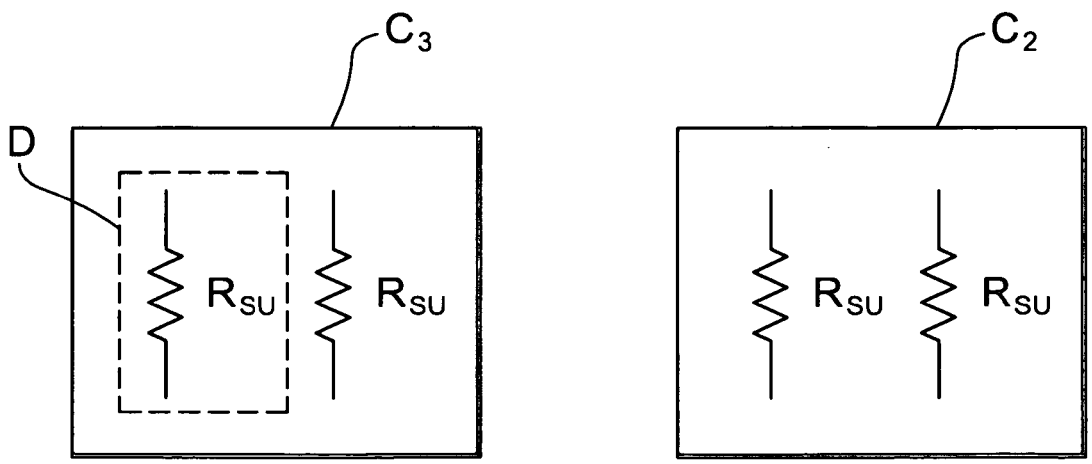

For example, referring again to the exemplary embodiments of FIGS. 2A–2C, assume, for a given application, that the circuit of FIG. 2A requires the resistive elements to be closely tracked according to the following ratios:

$$\frac{R_1}{R_2} = \frac{3}{2} \text{ and } \frac{R_3}{R_2} = \frac{0.5}{2},$$

wherein $R_2$ is the master component and wherein $R_3$ is a slave component, which is smaller than $R_2$. In this exemplary embodiment, as depicted in the exemplary diagrams of FIG. 2C, a unit cell C2 can be defined having a given layout area, and having 2 sub-unit elements, $R_{SU}$, which together comprise 1 unit element (e.g., 2 sub-unit elements of 0.5 Ohms for 1 unit element of 1 Ohms). In addition, a sub-unit cell, C3, which is a half-unit cell is the same size as the unit cell, C2, but uses one of the sub-elements as a dummy element (D). As explained hereafter, this design method enables formation of sub-unit cells (e.g., sub-unit cell C3, FIG. 2C), which have the same layout area of the full unit cells (e.g., unit cell C2, FIG. 2C), but which allows formation of smaller components whose size cannot be formed by a plurality of unit cells.

It is to be understood that a determination as to the size of a "unit cell" (which is used for forming "full-unit cell" and a "sub-unit cell") will vary depending on various factors. For example, such factors include the required granularity for enabling matching between master and slave components in ratios of 1:1 or any predetermined ratio of a:b, the amount of component cells that provide a maximum layout symmetry to achieve a desired level of device matching, as well as other factors as will be readily apparent to those of ordinary skill in the art based on the teachings herein.

Referring again to FIG. 1, after the unit cell and (possibly) sub-unit cell sizes are defined, a next step is to form the master and slave components using the unit cells (full-unit cells) or sub-unit cells (step 6). For instance, continuing with the above example for the resistive elements $R_1$, $R_2$ and $R_3$ with the ratios $$\frac{R_1}{R_2} = \frac{3}{2} \text{ and } \frac{R_3}{R_2} = \frac{5}{2},$$

assuming the full-unit cell, C1, is used, $R_1$ would be formed using 3n full-unit cells (C1), $R_2$ would be formed using 2n full-unit cells (C1) and $R_3$ would be formed using 5n unit cells (C1) (i.e., 10n total unit cells (C1)), wherein n is an integer greater than or equal to one depending on the unit resistance, $R_U$, and the actual resistance of elements $R_1$, $R_2$ and $R_3$ needed for the given application.

Furthermore, continuing with the above example for resistive elements $R_1$, $R_2$ and $R_3$ with the ratios $$\frac{R_1}{R_2} = \frac{3}{2} \text{ and } \frac{R_3}{R_2} = \frac{0.5}{2},$$

using the full-unit cell, C2, and the half-unit cell, C3, (FIG. 2C), $R_1$ would be formed using 3n full-unit cells (C2), $R_2$ would be formed using 2n full-unit cells (C2), and $R_3$ would be formed using n sub-unit cells (C3). In other words, in FIG. 2C, 5n total unit cells (C2) and n sub-unit cells (C3)) would be used to form the resistive elements $R_1$, $R_2$ and $R_3$, wherein n is an integer greater than or equal to one depending on the actual resistance value of elements $R_1$, $R_2$ and $R_3$ needed for the given application.

Referring again to FIG. 1, after the master and slave components are formed using the full-unit cells and sub-unit cells (step 6), an array structure having a given layout area on a semiconductor chip is defined to accommodate the plurality of full-unit cells and sub-unit cells needed for the master and slave components (and possibly, dummy unit cells) (step 7).

Then, the full-unit cells and sub-unit cells are optimally arranged in the array structure so as to minimize the device sensitivity to the environment. More specifically, in one exemplary embodiment, an initial step is to distribute the full-unit cells for the master component(s) uniformly and symmetrically in the array structure (step 8). The full-unit cells and sub-unit cells of the slave component(s) are then distributed in the array structure uniformly and symmetrically relative to the full-unit cells of the master component(s) (step 9).

Finally, if necessary, dummy unit cells are used to fill empty areas of the array (step 10). In particular, in one exemplary embodiment of the invention, the array structure will be defined such that the full-unit cells and sub-unit cells will be disposed primarily in a center portion of the array and the dummy cells will be disposed near the outer perimeter of the array.

The use of dummy cells enhances the matching of device characteristics by canceling the environmental impact. For example, surrounding the array of unit cells and sub-unit cells with dummy cells results in mitigating the well-proximity edge effect. For example, unit elements that are located near the edge of the array may experience different lithography exposure effect than those in the center of the array. Similarly, unit elements that are located in the vicinity of the shallow trench isolation boundary, well boundary, will behave differently than those away from the regions due to stress or ion scattering effects.

It is to be appreciated that the exemplary methods described above with reference to FIGS. 1 and 2A–2C, for example, can be applied to any circuit having components whose electrical properties and characteristics should be closely matched for purposes of efficient circuit operation. For instance, precision analog circuits or combination analog/digital circuits such as differential amplifiers, reference current generators, reference voltage generators, analog-to-digital converters, digital-to-analog converters, and regulators can be designed using circuit layout pattern designs and methods according to the invention for matching device characteristics.

For purposes of illustration, exemplary methods for constructing current mirror circuits, power level control circuits and bandgap voltage reference circuits will now be described with reference to the exemplary diagrams of FIGS. 3–10. However, nothing herein shall be construed as placing any limitation on the scope of the invention, as one of ordinary skill in the art can readily envision other circuits and applications for implementing the present invention.

Figure 3:
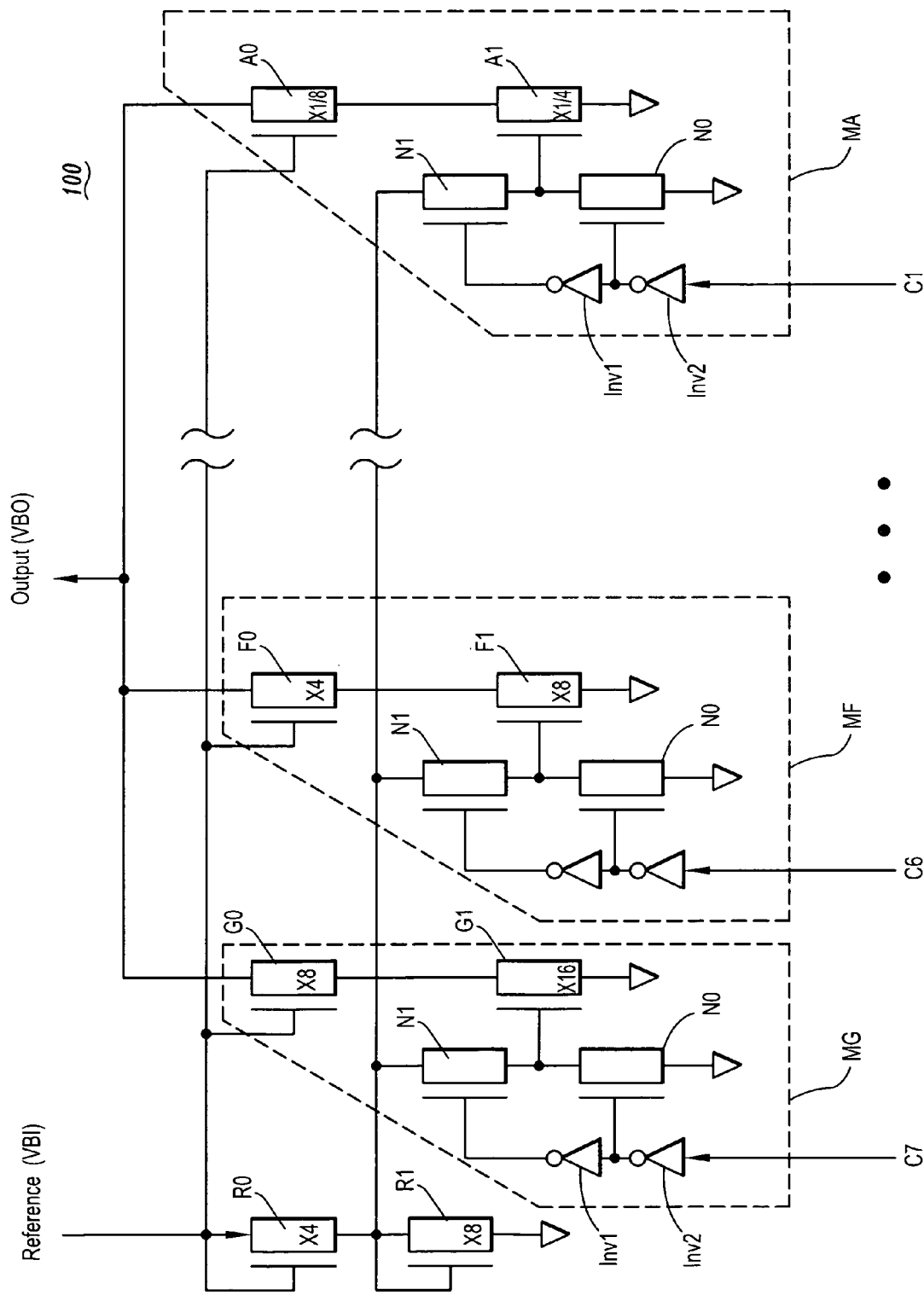
FIG. 3 is a schematic circuit diagram of an NMOS current mirror circuit, which can be designed and constructed using device matching techniques according to the invention.

Referring now to FIG. 3, a schematic diagram illustrates an NMOS current mirror circuit, which can be designed and constructed using device matching techniques according to the invention. More specifically, FIG. 3 schematically illustrates a cascode NMOS current mirror circuit (100), which comprises a plurality of current mirror circuits (MA, ..., MF, MG) and a reference circuit comprising NMOS transistor (R0) ("cascode" device) and NMOS transistor (R1) ("mirror" device). The NMOS transistors (R0) and (R1) are connected as diodes. In general, a reference current (VBI) is input to the reference circuit to generate an output current (VBO). The amount of output current (VBO) can be variably controlled in proportion to the input reference current (VBI) by selecting one or more of a plurality of current mirror circuits (MA~MG).

More specifically, each current mirror circuit (MA~MG) comprises a similar current mirror control portion comprising NMOS transistors (N0) and (N1) and a plurality of inverters (I1) and (I2). Each current mirror circuit (MA~MG) comprises a current mirror including, respectively, a first NMOS transistor (A0 ... F0, G0) ("cascode" device) and a second NMOS transistor (A1, ..., F1, G1) ("mirror" device). The ratio of the input reference current (VBI) to the output current (VBO) is determined by the size of the mirror device (R1) in the reference circuit (which is selected as the "master" circuit) and the size of the mirror devices (A1, ..., F1, G1) of the selected current mirror circuits. The cascode device (R0) is not used for current mapping and consequently, can be smaller in size than the mirror device (R0) to save area and reduce capacitance. The cascode configuration is used in current mirror circuits to reduce the channel modulation effect of the mirror devices so that they would operate in the saturation region.

As depicted in the exemplary embodiment of FIG. 3, a 7-bit control signal (C<1:7>) is used to select a given current mirror circuit (MA~MG) to control the current and power level output. When a given path is selected, a control signal of logic "high" is input to the inverter (I2) of the selected current mirror circuit, which causes NMOS transistor (N1) to turn On and NMOS transistor (N0) to turn Off. As a result, the gate of the mirror device (A1, ..., F1 or G1) is tied to the output of the mirror device (R1) through the NMOS device (N1), thereby generating an output current (VBO) that is proportional to the input reference current (VBI) according to some ratio determined by the relative sizes of the reference mirror device (R1) and the mirror device (A1 ... or G1) of the selected current mirror circuit.

More specifically, by way of example, the current mirror circuit (100) can operate as follows to generate a variable current and power level output. The least significant bit (LSB), C1, controls a path of A0 and A1, whose size and current are 1/32 of the reference devices R0 and R1. A second bit, C2, controls a path of B0 and B1, whose size and current are 1/16 of the reference devices R0 and R1. A third bit, C3, controls a path of C0 and C1, whose size and current are 1/8 of the reference devices R0 and R1. A fourth bit, C4, controls a path of D0 and D1, whose size and current are 1/4 of the reference devices R0 and R1. A fifth bit, C5, controls a path of E0 and E1, whose size and current are 1/2 of the reference devices R0 and R1. A sixth bit, C6, controls a path of F0 and F1, whose size and current are the same as the reference devices R0 and R1. And, a most significant bit (MSB), C7, controls a path of G0 and G1, whose size and current are twice as much (2×) as the reference devices R0 and R1.

Figure 4:
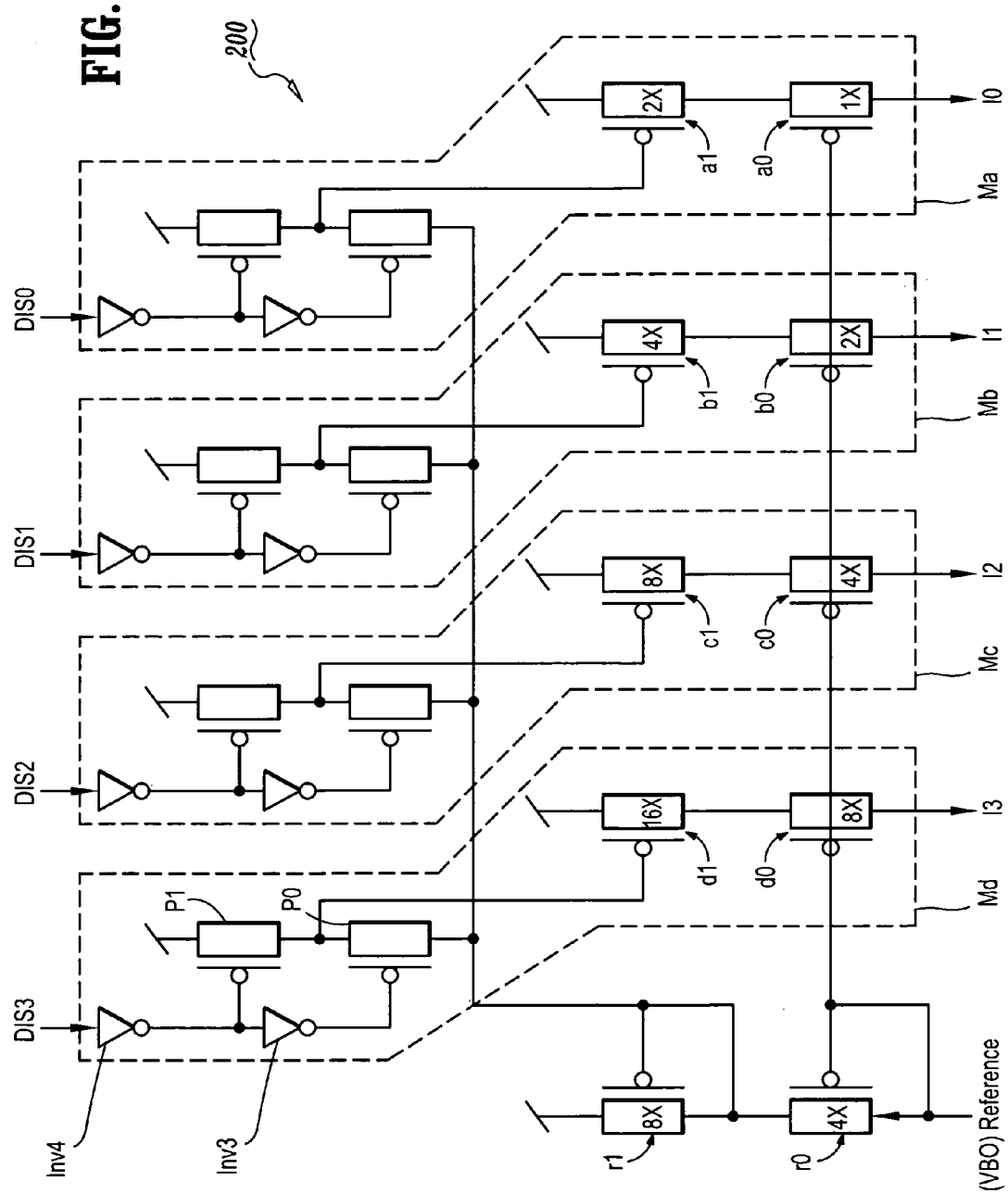
FIG. 4 is a schematic circuit diagram of a PMOS current mirror circuit, which can be designed and constructed using device matching techniques according to the invention.

FIG. 4 schematically illustrates a PMOS current mirror circuit, which can be designed and constructed using device matching techniques according to the invention. More specifically, FIG. 4 schematically illustrates a cascode PMOS current mirror circuit (200), which comprises a plurality of current mirror circuits (Ma, Mb, Mc, Md) and a reference circuit comprising PMOS transistor (r0) ("cascode" device) and PMOS transistor (r1) ("mirror" device). The PMOS transistors (r0) and (r1) are connected as diodes. In general, a reference current (VB0) is input to the reference circuit to generate one of output currents (I0, I1, I2, I3) via one of the current mirror circuits (Ma~Md). The amount of output current (I0~I3) can be variably controlled in proportion to the input reference current (VB0) by selecting one of a plurality of current mirror circuits (Ma~Md).

More specifically, each current mirror circuit (Ma~Md) comprises a similar current mirror control portion comprising PMOS transistors (P0) and (P1) and a plurality of inverters (Inv3) and (Inv4). Each current mirror circuit (Ma~Md) comprises a current mirror including, respectively, a first PMOS transistor (a0, b0, c0, d0) ("cascode" device) and a second PMOS transistor (a1, b1, c1, d1) ("mirror" device). The ratio of the input reference current (VB0) to the output current (I0, I1, I2, I3) is determined by the size of the mirror device (r1) (diode) in the reference circuit and the size of the mirror devices (a1, b1, c1, d1) of the selected current mirror circuits. In other words, the reference diode (r1) is sized to map the current from the input current to a plurality of output current. The diode (r0) is used as the cascode device to avoid channel modulation of the mirror devices. The diode (r0) is not used for current mapping and consequently, can be smaller in size than the mirror device (r1) to save area and reduce capacitance. As noted above, a cascode configuration is used in current mirror circuits to reduce the channel modulation effect of the mirror devices so that they would operate in the saturation region.

As depicted in the exemplary embodiment of FIG. 4, a 4-bit control signal (DIS<0:3>) is used to select a given current mirror circuit (Ma~Md) to control the current and power level output. When the control bit DIS(i) of logic "high" is input to the inverter (Inv4) of a selected path, the PMOS transistor (P1) will turn On and the PMOS transistor (P0) will turn Off. As a result, the gate of the mirror device (a1, b1, c1, d1) is tied to power supply (Vdd) causing the mirror device to be turned Off. On the other hand, when a control bit DIS(i) of logic "low" is input to the inverter (Inv4) of a selected path, the PMOS transistor (P1) will turn Off and the PMOS transistor (P0) will turn ON. As a result, the gate of the mirror device (a1, b1, c1, d1) is tied to the output of the reference mirror diode (r1) through the PMOS device (P0), thereby generating an output current (I0, I1, I2, I3) from the selected path, which is proportional to the input reference current (VBI) according to some ratio determined by the relative sizes of the reference mirror device (r1) and the mirror device (a1, b1, c1, d1) of the selected current mirror circuit.

More specifically, by way of example, the current mirror circuit (200) can operate as follows to generate a variable current and power level output. The least significant bit (LSB), DIS0, controls the current mirror path of a0 and a1, whose size and current are ¼ of the reference devices r0 and r1. The second bit, DIS1, controls the current mirror path of b0 and b1, whose size and current are ½ of the reference devices r0 and r1. The third bit, DIS2, controls the current mirror path of c0 and c1, whose size and current are the same as the reference devices r0 and r1. And, the fourth bit, DIS3, controls the current mirror path of D0 and D1, whose size and current are twice as much as the reference devices r0 and r1.

Figure 5:
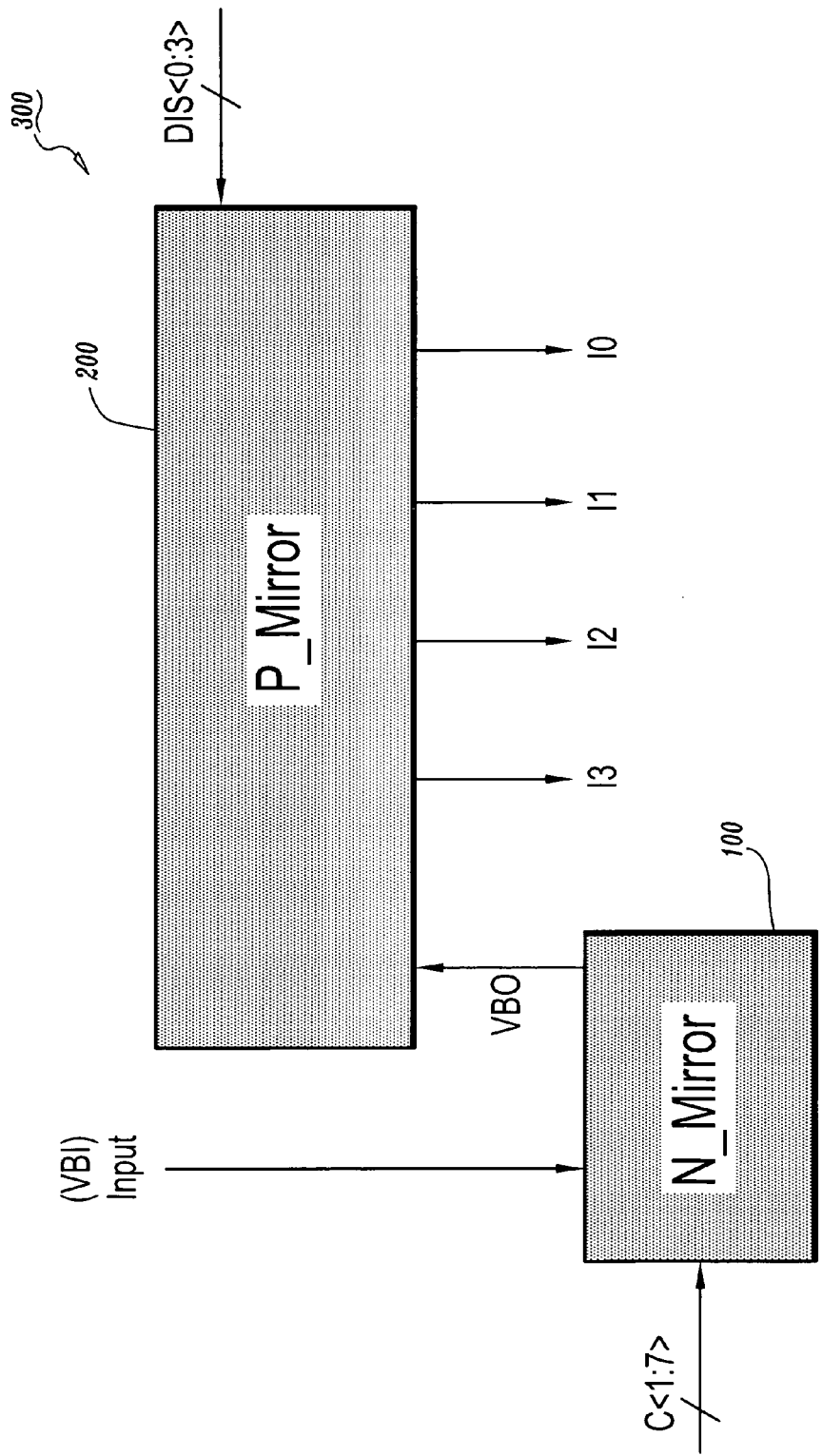
FIG. 5 is a schematic diagram of a power level control circuit, which can be designed and constructed using device matching techniques according to the invention.

FIG. 5 is a schematic diagram of a power level control circuit (300), which can be designed using the NMOS current mirror circuit (100) and the PMOS current circuit (200), discussed above with reference to FIGS. 3 and 4. As depicted in FIG. 5, the output current (VB0) of the NMOS current mirror circuit (100) is input as a reference current to the PMOS current mirror circuit (200). In particular, the NMOS current mirror circuit (100) receives as input a reference current (VBI) and generates an intermediate current output (VB0), depending on the logic level of the control signal C<1:7>. The PMOS mirror circuit (200) is controlled by the control signal DIS<0:3>, and receives the intermediate current (VBO) as the reference current input to generate one of I0, I1, I2, or I3 as the current output depending on the logic level of the control signal DIS<0:3>.

It is to be appreciated that the NMOS current mirror circuit (100), PMOS current mirror circuit (200) and the current and power level control circuit (300) can be designed and constructed using techniques according to the invention, such as the exemplary methods described above with reference to FIG. 1, for example, to provide precise device matching of components of such circuits.

In particular, as noted above, the initial steps for designing a layout pattern is to select the master and slave components whose electrical characteristics should be matched for efficient circuit operation. With respect to the current mirror circuit (100) of FIG. 3, in one embodiment of the invention, the reference devices (R0) and (R1) are selected as the "master" components, whereas the elements (A0~G0) and (A1~G1) are selected as the "slave" components. Such selection of master and slave components is desirable given that the ratio between the input reference current (VBI) (in current path R0, R1) and the output current (VB0) (in the current path of the selected current mirror) is determined by the relative sizes of reference mirror device (R1) and mirror devices (A1~G1).

Similarly, with respect to the current mirror circuit (200) of FIG. 4, in one embodiment of the invention, the reference devices (r0) and (r1) are selected as the "master" components, whereas the elements (a0~d0) and (a1~d1) are selected as the "slave" components. Such selection of master and slave components is desirable given that the ratio between the input reference current (VBI) (in current path r0, r1) and the output current (I1~I4) (in the current path of the selected current mirror) is determined by the relative sizes of reference mirror device (r1) and mirror devices (a1~d1).

Next, with the master and slave components selected, a layout pattern for the NMOS mirror circuit (100) and PMOS mirror circuit (200) can be determined such that the layout optimizes the matching of electrical characteristics between the master and slave components. An exemplary process of defining full-unit cells and sub-unit cells for the master and slave components and generating an array for the cells will be discussed with reference to the exemplary diagrams of FIGS. 6A–B and 7A–B, for example.

Figures 6A, 6B:
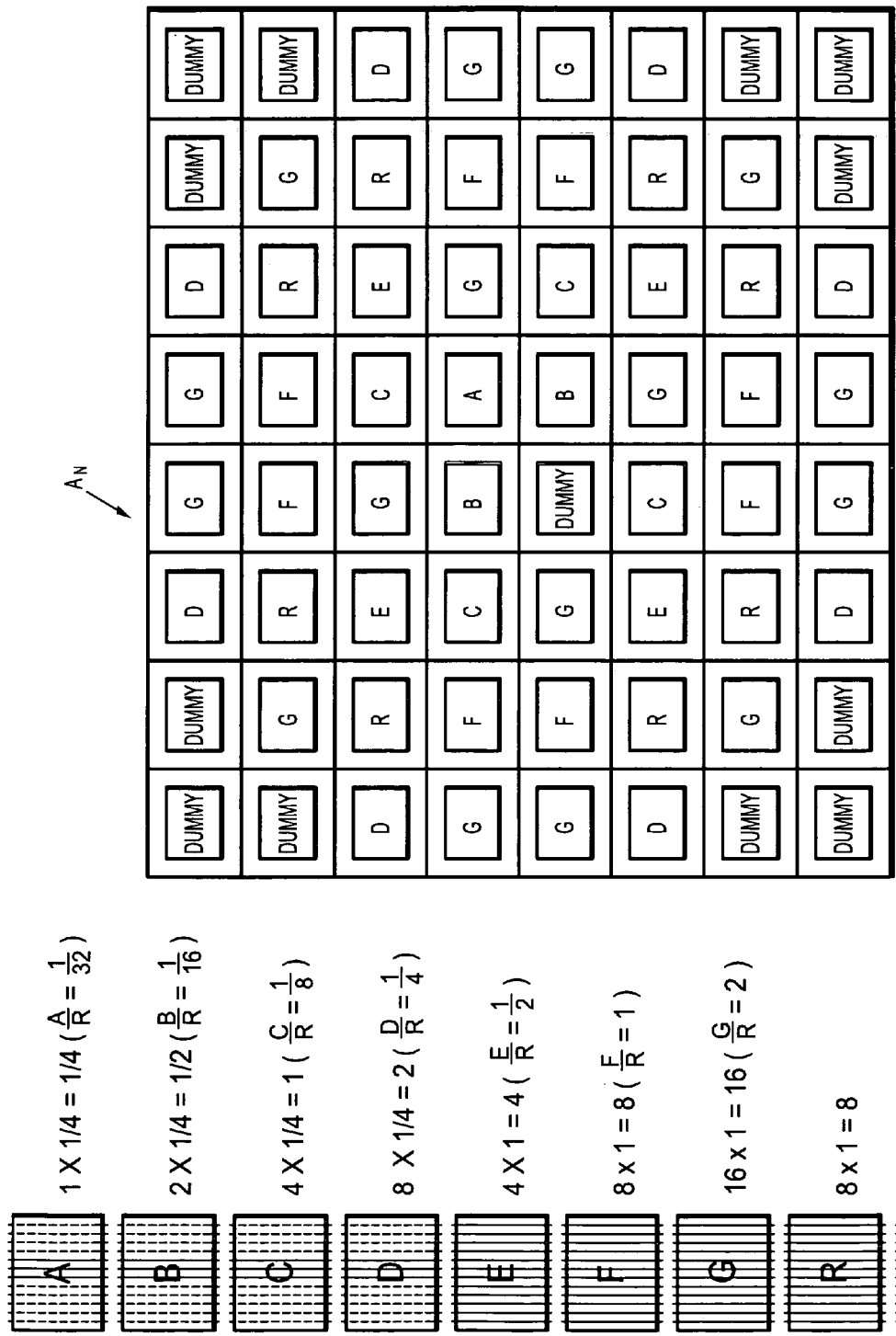
FIGS. 6A and 6B are diagrams illustrating exemplary design methods and circuit layouts according to the invention for forming unit cells for master and slave components of the NMOS mirror circuit of FIG. 4 and forming an array of such cells.

In particular, FIG. 6A illustrates an exemplary method for forming full-unit and sub-unit cells for the current mirror component (master and slave components) of the exemplary NMOS current mirror circuit (100). FIG. 6B is a schematic diagram illustrating a circuit layout and method for optimally placing the full-unit and sub-unit cells of the master and slave components in an array structure, according to an exemplary embodiment of the invention.

As noted above, an initial step is to define the size of a unit cell and, if needed, one or more sub-unit cell for the master and slave components (e.g., steps 4 and 5, FIG. 1). Here, the components to be formed using the unit cells and sub-unit cells comprise NMOS transistors, where the current characteristics, for example, are determined by the width (W) and length (L) of the transistor channel. In one exemplary embodiment of the invention, the desired size ratios between the master and slave transistor components are obtained by keeping the transistor channel length L the same, while varying the channel widths W proportionally. In particular, by way of example, for a given channel length L, a transistor having a channel width of W will be twice the size of a transistor having a channel width of 0.5 W.

The illustrative embodiment of FIG. 6A illustrates a plurality of equal size unit cells (A, B, C, D, E, F, G, R and DUMMY), which include full-unit cells (i.e., R (master components) and E, F and G (slave components)), sub-unit cells (i.e., A, B, C and D (slave components)), and a dummy cell (DUMMY). Each full-unit cell of circuit layout is formed by 12 poly-gate elements of equal channel width, wherein 4 of the elements are used for the "cascode" components and 8 of the elements are used for the "mirror" components (since, in the exemplary embodiment of FIG. 3, the sizes of the cascode components are half the size of the mirror components).

Furthermore, as depicted in FIG. 6A, each sub-unit cell (A, B, C and D) is a quarter-unit cell. In particular, each sub-unit cell of circuit layout has the same size as a full-unit cell, being formed by 12 poly-gate elements of equal channel width, but only 3 of such poly-gate elements are actually used (as indicated by the solid lines), whereas 9 of such poly gate elements are dummy gates (as indicated by the dotted lines). In particular, 1 poly-gate element is used for the cascade component and 2 elements are used for the mirror component.

FIG. 6B illustrates an exemplary array structure ($A_N$) comprising an arrangement of a plurality of the exemplary cells of FIG. 6A. In this exemplary embodiment, the number of the full-unit cells and sub-unit cells that are used to form the slave and master components in the array ($A_N$) will depend on factors, such as, the cell structures, the desired size ratios between the master and slave components, optimal distribution of a given layout area, for example, as well as other factors as would be readily envisioned by one of ordinary skill in the art.

In the exemplary embodiments of FIGS. 6A and 6B, the array ($A_N$) comprises 8 full-unit cells (R), for example, forming the master (reference) components R0 and R1 (FIG. 3). The master component cells (R) are arranged in a ring shape inside the array ($A_N$), and the slave component cells are evenly and symmetrically distributed in the array around the master component cells. The amount of cells used for the slave components will vary depending on the required size ratios between the reference and slave mirror elements. For the slave components that are smaller than the master components, multiple quarter units are used so such components can be evenly distributed in the array.

In particular, the exemplary embodiment of FIG. 6b depicts slave component cells distributed as follows: (i) 1 sub (quarter)-unit cell (A), which forms slave components A0 and A1, is placed in proximity to the center of the array; (ii) 2 sub (quarter)-unit cells (B), which form slave components B0 and B1, are symmetrically placed near the center of the array; (iii) 4 sub (quarter)-unit cells (C), which form slave components C0 and C1, are symmetrically placed in the array; (iv) 8 sub (quarter)-unit cells (D), which form slave components D0 and D1, are symmetrically placed in the array; (v) 4 full-unit cells (D), which form slave components E0 and E1, are symmetrically placed in the array; (vi) 8 full-unit cells (F), which form slave components F0 and F1, are symmetrically placed in the array; and (vii) 16 full-unit cells (G), which form slave components G0 and G1, are symmetrically placed in the array. Furthermore, the remaining lots of the array ($A_N$) are filled with dummy cells (DUMMY) to provide a uniform pattern density.

Figure 7B:
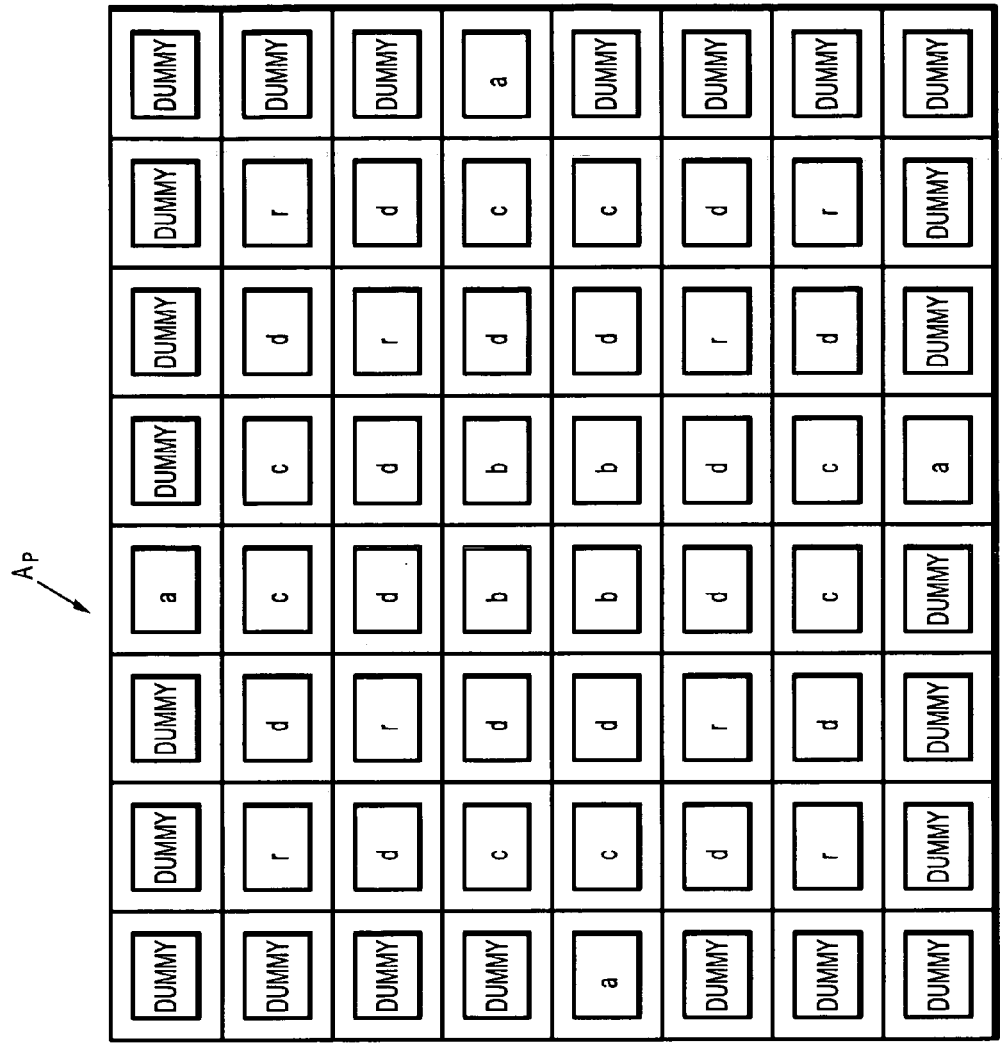
FIGS. 7A and 7B are diagrams illustrating exemplary design methods and circuit layouts according to the invention for forming unit cells for master and slave components of the PMOS mirror circuit of FIG. 5 and forming an array of such cells.
Figure 7A:
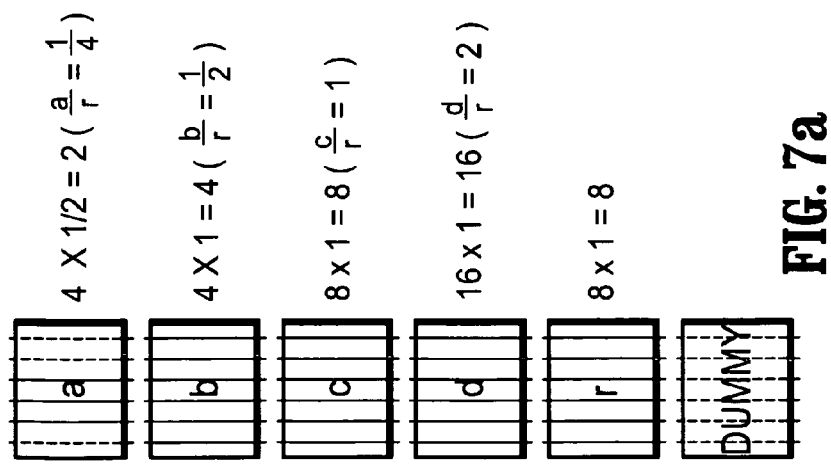

FIG. 7A illustrates an exemplary method for forming full-unit and sub-unit cells for the current mirror component (master and slave components) of the exemplary PMOS current mirror circuit (200), FIG. 4. The illustrative embodiment of FIG. 7A illustrates a plurality of equal size cells (a, b, c, d, r and DUMMY), which include full-unit cells (i.e., (r) (master component) and (b), (c) and (d) (slave components)), a sub-unit cell (i.e., (a) (slave component)), and a dummy cell (DUMMY).

Similar to the exemplary methods described above with reference to FIG. 6A, each full-unit cell is formed by 6 poly-gate elements of equal channel width, wherein 2 of such elements are used for the "cascode" elements and 4 of such elements are used for the "mirror" elements (since, in the exemplary embodiment of FIG. 4, the sizes of the cascode components are half the sizes of the mirror components).

Furthermore, the sub-unit cell (a) is a half-unit cell, which has the same size as a full-unit cell, being formed by 6 poly-gate elements of equal channel width, but only 3 of such poly-gate elements are actually used (as indicated by the solid lines), whereas 3 of such poly-gate elements are dummy gates (as indicated by the dotted lines). In particular, 1 element is used for the cascode component and 2 elements are used for the mirror components.

FIG. 7B is a schematic diagram illustrating a circuit layout and method for optimally placing the unit/sub-unit cells, which form the master and slave components, in an array structure, according to an exemplary embodiment of the invention. FIG. 7B illustrates an exemplary array structure ($A_P$) comprising an arrangement of a plurality of the exemplary cells of FIG. 7A. The array ($A_P$) comprises 8 full-unit cells (r), for example, forming the master (reference) components r0 and r1 (FIG. 4). The master component cells (r) are symmetrically arranged in the array ($A_P$), and the slave component cells are evenly and symmetrically distributed in the array around the master component cells. The amount of cells used for the slave components will vary depending on the required size ratios between the reference and slave mirror elements. For the slave components that are smaller than the master components, multiple half-units are used so such components can be evenly distributed in the array.

In particular, FIG. 7B depicts slave component cells distributed as follows: (i) 4 sub (half)-unit cells (a), which form slave components a0 and a1, are placed symmetrically in the array; (ii) 4 full-unit cells (b), which form slave components b0 and b1, are placed symmetrically near the center of the array; (iii) 8 full-unit cells (c), which form slave components c0 and c1, are symmetrically placed in the array; and (iv) 16 full-unit cells (d), which form slave components d0 and d1, are symmetrically placed in the array. The remaining lots of the array ($A_P$) are filled with dummy cells (DUMMY) to provide a uniform pattern density.

In the exemplary embodiments of FIGS. 6A–B and 7A–B, it is to be appreciated that the current mirror circuit elements are formed by a plurality of cells that are evenly distributed in an array to ensure, as much as possible, a uniform and symmetrical environmental impact so that the desired ratios between the reference mirror device and slave mirror devices will be insensitive to layout environment.

Figure 8:
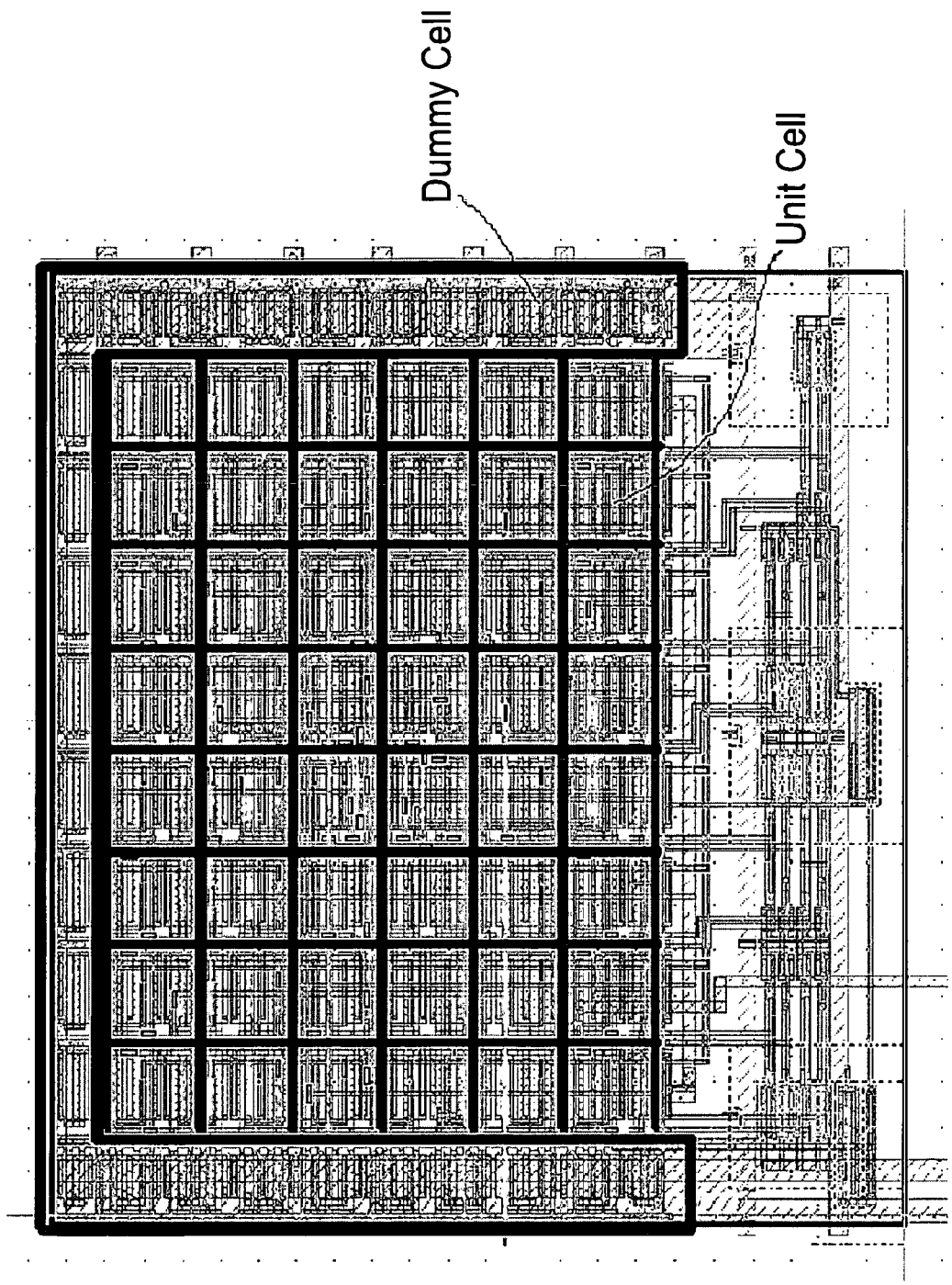
FIG. 8 illustrates an actual implementation of an array layout according to an exemplary embodiment of the invention for matching device characteristics of sensitive components of a current mirror circuit.

FIG. 8 illustrates an actual physical layout of a current mirror circuit block, which has been implemented using design techniques according to the invention for matching device characteristics. The master reference cells and slave mirror cells are distributed uniformly in an array (the area having a checkerboard overlay). The peripheral devices such as inverters and switches are located at the bottom of the array. Experimental results on the circuit of FIG. 8 have indicated that design methods according to the invention can effectively eliminate environmental disturbances that may cause a mismatch of device characteristics. Indeed, subject to minimal, insignificant variations, the device current readily achieved the design target.

Figure 9:
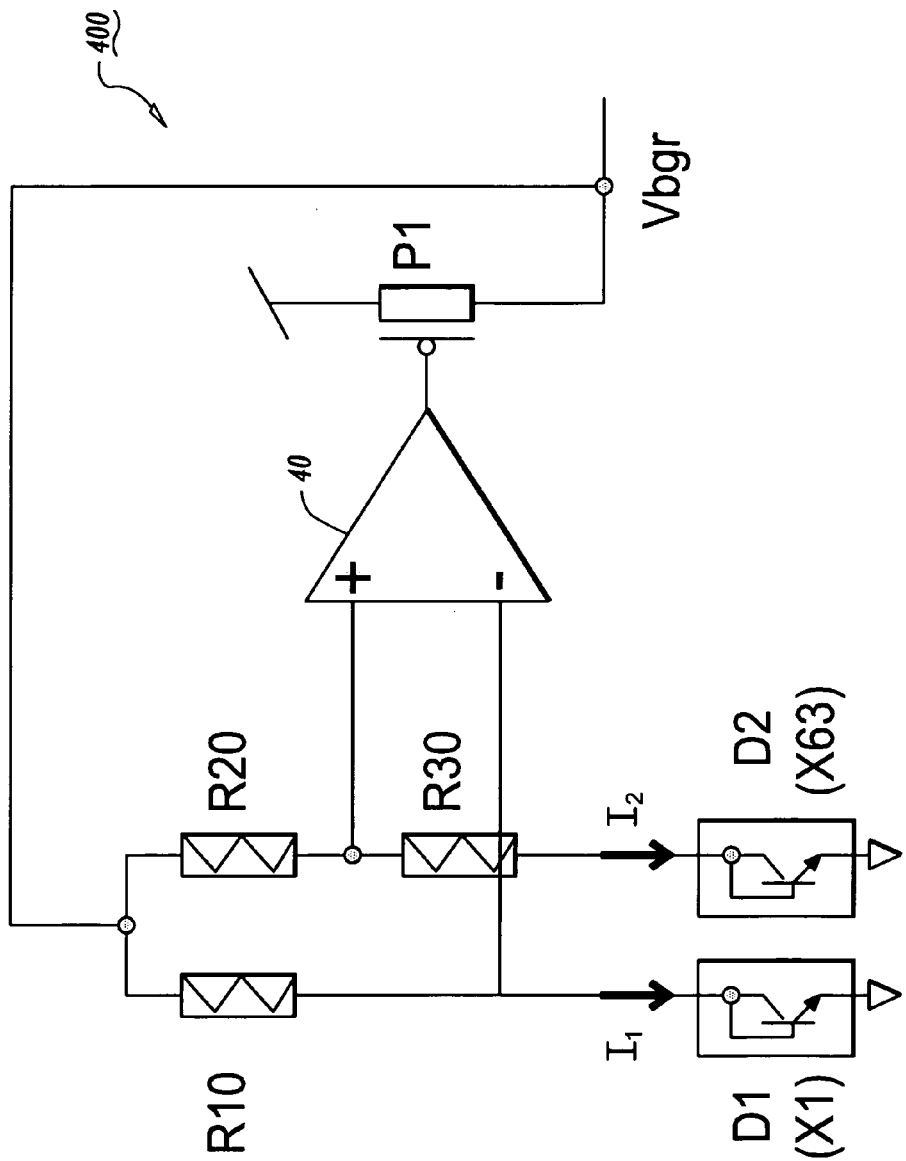
FIG. 9 is a schematic circuit diagram of a bandgap reference voltage circuit, which can be designed and constructed using device matching techniques according to the invention.

Referring now to FIG. 9, a schematic diagram illustrates bandgap reference circuit, which can be designed and constructed using device matching techniques according to the invention. More specifically, FIG. 9 illustrates a bandgap reference circuit (400) comprising a first bipolar device (D1) and a second bipolar device (D2), which are connected as diodes, a voltage divider circuit comprising resistors (R10, R20, R30), a differential amplifier (40) and a PMOS transistor (P1). The devices (D1) and (D2), which have a fixed area ratio (D2/D1=63/1), set an output reference voltage ($V_{BGR}$). Assuming diodes (D1) and (D2) have emitter-base areas of $A_{E1}$ and $A_{E2}$, respectively, the voltage across R30 is given by:

$$V_{R30} = V_{BE1} - V_{BE2} = Vt\ln\left(\frac{J_1}{J_{S1}}\right) - Vt\ln\left(\frac{J_2}{J_{S2}}\right) = Vt\ln\left(\frac{I_1 A_{E2}}{I_2 A_{E1}}\right)$$

Since the differential amplifier forces the relationship $I_1 R_{10} = I_2 R_{20}$, the reference voltage can be written as:

$$V_{BGR} = V_{BE1} + I_2 R_{20} = V_{BE1} + V_{R30}\left(\frac{R_{20}}{R_{30}}\right) =$$
$$V_{BE1} + \left(\frac{R_{20}}{R_{30}}\right)(V_{BE1} - V_{BE2}) = V_{BE1} + \left(\frac{R_{20}}{R_{30}}\right)Vt\ln\left(\frac{R_{20} A_{E2}}{R_{10} A_{E1}}\right)$$

Furthermore, from the above equation, we see that $V_{BGR} = V_{BE1} + KVt$. In particular, the output voltage is determined by the base-to-emitter voltage $V_{BE1}$ of the first bipolar device, and $V_{R30}$, the difference of the base-to-emitter voltages of the two bipolar devices. Since the first term $V_{BE1}$ has a negative temperature coefficient of −2.2 mV/° C. at room temperature, and Vt (=kT/q) in the second term has a positive temperature coefficient of +0.085 mV/° C., the exemplary methods and layout patterns described herein in accordance with the present invention can be used to distribute the resistors and diodes to render the bandgap reference voltage independent of temperature variations.

Figure 10:
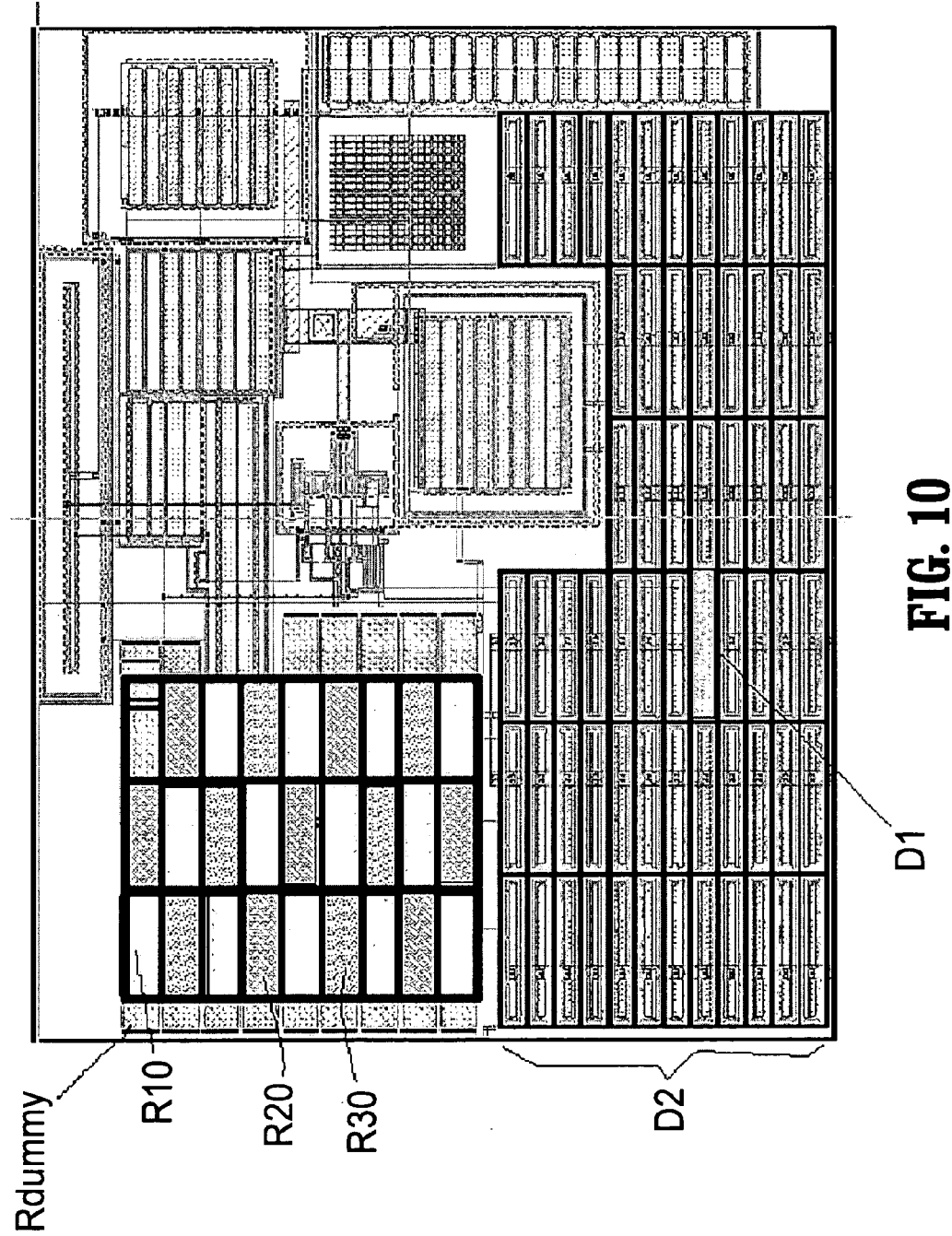
FIG. 10 illustrates an actual implementation of an array layout according to an exemplary embodiment of the invention for matching device characteristics of sensitive components of bandgap voltage reference circuit.

FIG. 10 illustrates an actual physical layout of a bandgap reference circuit such as depicted in FIG. 9. The smaller diode (D1) that comprises one unit cell (X1) is located at the center of an array comprising 63 unit cells (X63) that collectively form the larger diode D2, which ensures a uniform and symmetrical environmental impact. In addition, the resistors R10, R20, and R30 are also formed by unit cells, which are mixed as uniformly as possible and surrounded by dummy resistor devices (Rdummy), to render the resistor ratios insensitive to the layout environment.

As noted above, the exemplary methods described herein can be applied to any circuit having components whose electrical properties and characteristics should be closely matched for purposes of efficient circuit operation. For example, in a differential amplifier, both sides of the amplifier must be identical to ensure that the jitter performance will not be compromised. In general, the basic matching components for a differential amplifier are emitter-coupled pairs in bipolar circuits, and source-coupled pairs in junction field effect transistor (JFET) or metal oxide semiconductor field effect transistor (MOSFET) circuits. Other sensitive components of a differential amplifier, such as resistors, inductors, and capacitors can also be matched using methods described herein in accordance with the invention.

In summary, exemplary embodiments of the invention can eliminate or significantly minimize device size mismatch due to process variations from uneven layout pattern density, as well as threshold voltage mismatch due to doping concentration and oxidation rate variation from well proximity effect. Exemplary embodiments of the invention provide methods that enable device characteristics or properties to be precisely or proportionally matched by subdividing components using unit elements (full-unit cells and/or sub-unit cells) and maximizing layout symmetry by evenly distributing slave components around master components in an array structure.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for matching electrical characteristics of components of a semiconductor integrated circuit, comprising the steps of:
   dividing at least a first component and a second component of a semiconductor integrated circuit into a plurality of unit cells, wherein the first component and second component are components whose electrical properties are to be precisely or proportionally matched, and wherein each unit cell is the same size; and
   Uniformly distributing the plurality of unit cells for the first and second components in an array,
   wherein dividing at least a first component and a second component of a semiconductor integrated circuit into a plurality of unit cells, comprises:
   defining a full-unit cell that includes a plurality of sub-elements, wherein each sub-element is used for forming a component;
   defining a sub-unit cell having a same layout area and amount of sub-elements as the full-unit cell, wherein at least one or more of the sub-elements are dummy elements; and
   determining a number full-unit cells and sub-unit cells to be used for forming the first component and the second component.

2. The method of claim 1, further comprising placing a plurality of dummy cells in the array, wherein each dummy cell is the same size as a unit cell.

3. The method of claim 2, wherein the dummy cells are placed near an outer perimeter of the array.

4. The method of claim 1, wherein the step of uniformly distributing the plurality of unit cells for the first and second components in an array comprises uniformly distributing unit cells of the first component in the array and evenly distributing unit cells of the second component around the unit cells of the first component.

5. The method of claim 1, wherein the sub-unit cell is defined based on an area ratio between the first component and the second component.

6. The method of claim 5, wherein the area ratio is selected to obtain a resistance ratio, inductance ratio, capacitance ratio, current ratio, or voltage ratio.

7. The method of claim 1, wherein the first and second components are semiconductor transistors, resistors, capacitors, or inductors.

8. The method of claim 1, wherein the semiconductor integrated circuit is a differential amplifier, a reference current generator, a reference voltage generator, an analog-to-digital converter, a digital-to-analog converter, or a regulator.

9. A method for matching electrical characteristics of components of a semiconductor integrated circuit, comprising the steps of:
   determining a slave components of a semiconductor integrated circuit having an electrical characteristic $C_1$ to be matched to a corresponding electrical characteristic $C_2$ of a master reference compotent in a ratio of $C_1/C_2 \neq 1$;
   defining a size of a unit cell for the master reference and slave components;
   forming each of the master reference and slave components using one of more unit cells;
   defining an array comprising a plurality of cell lots for receiving unit cells;
   uniformly distributing all unit cells of the master reference and slave components in the array; and
   placing a dummy cell in each cell lot of the array not occupied by a unit cell.

10. The method of claim 9, wherein the ratio is a resistance ratio, an inductance ratio, a capacitance ratio, a current ratio, or voltage ratio.

11. The method of claim 9, wherein defining a size of a unit cell for the components comprises determining a number of sub-elements included in the unit cell.

12. The method of claim 9, wherein defining an array comprising a plurality of cell lots for receiving unit cells comprises defining an array structure having a plurality of cell lots disposed in rows and columns.

13. The method of claim 9, wherein uniformly distributing all unit cells of the master reference and slave components in the array comprises:
   distributing all unit cells of the master reference component uniformly and symmetrically in a central region of the array; and distributing all unit cells of the slave component uniformly and symmetrically relative to the locations of the unit cells of the master reference component in the array.

14. The method of claim 9, wherein uniformly distributing all unit cells of the components in the array comprises placing the unit cells in cell lots substantially in and around a central region of the array.

15. The method of claim 14, wherein placing a dummy cell in each cell lot of the array not occupied by a unit cell comprises placing dummy cells in cell lots adjacent a perimeter of the array.

16. A method for matching electrical characteristics of components of a semiconductor integrated circuit, comprising the steps of:
determining components of a semiconductor integrated circuit whose electrical characteristics are to be matched;
defining a unit cell for the components, wherein the unit cell comprises a plurality of sub-elements and wherein the unit cell has a layout area;
defining a sub-unit cell for the components based on the unit cell, wherein the sub-unit cell has the same number of sub-elements and layout area of the unit cell, wherein one or more of the sub-elements of the sub-unit cell are dummy elements;
forming each component using one of more unit cells or one or more sub-unit cells;
defining an array comprising a plurality of cell lots for receiving unit cells or sub-unit cells;
uniformly distributing all unit cells and sub-unit cells of the components in the array; and
placing a dummy cell in each cell lot of the array not occupied by a unit cell or sub-unit cell.

17. The method of claim 16, wherein determining components of a semiconductor integrated circuit whose electrical characteristics are to be matched comprises determining the components whose electrical properties should be tracked to maintain a resistance ratio, an inductance ratio, a capacitance ratio, a current ratio, or voltage ratio.

18. The method of claim 16, wherein defining an array comprising a plurality of cell lots comprises defining an array structure having a plurality of cell lots disposed in rows and columns.

19. The method of claim 16, wherein uniformly distributing all unit cells and sub-unit cells of the components in the array comprises:
distributing all unit cells of a first component uniformly and symmetrically in the array; and
distributing all unit cells of a second component uniformly and symmetrically relative to the locations of the unit cells of the first components in the array.

20. The method of claim 16, wherein uniformly distributing all unit cells and sub-unit cells of the components in the array comprises evenly distributing the cell lots of unit cells and sub-unit cells substantially in and around a central region of the array.

21. The method of claim 20, wherein placing a dummy cell in each cell lot of the array not occupied by a unit cell or sub-unit cells comprises placing dummy cells in cell lots adjacent a perimeter of the array.

22. A semiconductor integrated circuit chip, comprising:
an integrated circuit comprising a plurality of components, wherein each component is formed from one or more unit cells, wherein the unit cells comprisefull-unit cells and sub-unit cells, wherein each full-unit cell comprises a plurality of sub-elements that are used for forming a circuit component, wherein each sub-unit cell comprises a same number of sub-elements as each full-unit cell, wherein one or more of the sub-elements of each sub-unit cell are dummy elements, and wherein the unit cells are uniformly distributed in an array structure.

23. The semiconductor integrated circuit chip of claim 22, wherein the unit cells are associated with at least a first component and a second component whose electrical properties are to be precisely or proportionally matched.

24. The semiconductor integrated circuit chip of claim 22, wherein the array structure further comprises a plurality of dummy cells.

25. The semiconductor integrated circuit chip of claim 24, wherein each unit cell is the same size and wherein each dummy cell is the same size as the unit cells.

26. The semiconductor integrated circuit chip of claim 24, wherein the dummy cells are placed near an outer perimeter of the array structure.

27. The semiconductor integrated circuit chip of claim 23, wherein the unit cells for the first component are evenly distributed in the array structure and wherein the unit cells of the second component are evenly distributed around the unit cells of the first component.

28. The semiconductor integrated circuit chip of claim 22, wherein one or more sub-unit cells are used for forming circuit components having different area ratios.

29. The semiconductor integrated circuit chip of claim 28, wherein different area ratios are selected to obtain a resistance ratio, inductance ratio, capacitance ratio, current ratio, voltage ratio, transistor width ratio, or other device size ratios.

30. The semiconductor integrated circuit chip of claim 22, wherein the circuit components are semiconductor transistors, resistors, capacitors, or inductors.

31. The semiconductor integrated circuit chip of claim 22, wherein the circuit is a differential amplifier, a reference current generator, a reference voltage generator, an analog-to-digital converter, a digital-to-analog converter, or a regulator.

* * * * *